(12) United States Patent
Eckhardt et al.

(10) Patent No.: US 6,284,827 B1
(45) Date of Patent: Sep. 4, 2001

(54) POLYMERIZABLE FLUORINE-CONTAINING COMPOSITION, USE THEREOF, AND PROCESS FOR THE PREPARATION OF CURED POLYMER MASSES FROM SAID COMPOSITION

(75) Inventors: Gunther Eckhardt, Frieding; Dietmar Dengler, Landsberg; Ursula Somnitz, Weilheim, all of (DE)

(73) Assignee: Delo Industrieklebstoffe GmbH Co. K (DE)

( * ) Notice: Subject to any disclaimer, the term of this patent is extended or adjusted under 35 U.S.C. 154(b) by 0 days.

(21) Appl. No.: 09/266,390

(22) Filed: Mar. 11, 1999

(51) Int. Cl.$^7$ ................................................... C08K 5/09
(52) U.S. Cl. ................................................... 524/400
(58) Field of Search ............................................. 524/400

(56) References Cited

U.S. PATENT DOCUMENTS

| 5,154,791 | 10/1992 | Gasser et al. | 156/273.3 |
| 5,296,567 | 3/1994 | Baumann et al. | 526/172 |
| 5,436,279 | 7/1995 | Grundke et al. | 522/14 |
| 5,846,853 | 12/1998 | Otsuki et al. | 438/119 |

FOREIGN PATENT DOCUMENTS

| 424 24 08 | 2/1998 | (DE) . | |
| 0514630 | 11/1992 | (EP) . | |
| 0533465 | 3/1993 | (EP) | C08L/63/00 |
| 0388775 | 2/1994 | (EP) | C09J/5/00 |
| 0799682 | 10/1997 | (EP) . | |
| 85-090479 | 8/1983 | (JP) . | |

OTHER PUBLICATIONS

"Epoxy Prepolymers Cured with Boron Tribluoride–amine Complexes, 1" Bouillon et al Makromol. Chem. 191; 1403–1416; (1990).

Primary Examiner—Edward J. Cain
(74) Attorney, Agent, or Firm—Haynes, Soloway, Hennessey, Grossman & Hage, P.C.

(57) ABSTRACT

A polymerizable fluorine-containing composition is proposed, containing at least one polymerizable compound and at least one fluorine-containing compound, which for reducing the content of fluoride ions extractable with water of cured polymer masses obtainable from the composition additionally contains at least one magnesium compound. The composition is particularly suitable for bonding, potting and coating of electronic devices and for mounting electronic devices on printed circuit boards. Further proposed is a process for the preparation of cured polymer masses having a reduced content of fluoride ions extractable with water, comprising polymerizing and curing the composition to which at least one magnesium compound is added prior to the polymerization.

27 Claims, No Drawings

POLYMERIZABLE FLUORINE-CONTAINING COMPOSITION, USE THEREOF, AND PROCESS FOR THE PREPARATION OF CURED POLYMER MASSES FROM SAID COMPOSITION

The invention relates to a polymerizable fluorine-containing composition and use thereof for the preparation of cured polymer masses having a reduced content of fluoride ions extractable with water. The invention further relates to the use of this composition as a bonding, sealing, coating and potting material, more particularly in such fields of application where a high content of fluoride ions extractable with water is undesirable.

It is known to employ fluorine-containing formulation constituents for the preparation of reaction masses curing by polyreactions. For example, fluorine-containing monomers or fluorine-containing fillers or additives are used. It is further known to employ fluorine-containing initiators or catalysts in order to achieve satisfactory curing rates. There is extensive use of fluorine-containing photoinitiators comprising perfluorinated anions, and such use has been described in many patent documents, for example in Use of borofluoride complexes as catalysts for polyreactions is likewise known (cf. Makromolekulare Chemie 191 (1990), p. 1403). What is a disadvantage in connection with the use of fluorine-containing formulation constituents in compositions curing by polyreactions is the usually very high content of fluoride ions extractable with water of the cured masses. This proportion of readily mobile ions can be undesirable when applying the compositions. When the compositions are used for bonding, potting and coating of electronic devices or in mounting such devices, a high proportion of fluoride ions extractable with water may result in the appearance of corrosion and thus impair the operability of the devices.

It is the object of the invention to propose polymerizable compositions containing fluorine-containing formulation constituents and resulting in cured masses having a reduced content of fluoride ions extractable with water.

This object is achieved in accordance with the invention in that the composition containing at least one polymerizable compound and at least one fluorine-containing compound additionally contains at least one magnesium compound and has, after curing, a low content of fluoride ions extractable with water.

It has been surprisingly found that by adding at least one magnesium compound the content of such fluoride ions which are extractable with water of the cured polymer mass obtained from the polymerizable composition is distinctly reduced as compared with the content of fluoride ions extractable with water of cured polymer masses of the known type, which differ from the masses obtainable according to the invention merely in that the polymerizable fluorine-containing compositions have no magnesium compound(s) added thereto. Preferably, the content of fluoride ions extractable with water after curing is lower by at least 40% as compared with the content of fluoride ions extractable with water of an otherwise identical composition which does not contain a magnesium compound. In a particularly preferred composition the content of fluoride ions extractable after curing is lower by at least 60% than without a magnesium compound.

The surprising effect of the addition of one or more magnesium compound(s) has, to date, never been described nor even presumed in the previously published prior art.

In an advantageous embodiment of the invention the polymerizable fluorine-containing composition contains the at least one magnesium compound in an amount of from 0.001 to 60 parts by mass, in an especially preferred embodiment in an amount of from 0.01 to 10 parts by mass, each per 100 parts by mass of the total composition.

Within the ranges indicated, the required concentration of the magnesium compound(s) may be set in wide limits. In general, even small proportions of a magnesium compound, for instance 0.05 parts by mass per 100 parts by mass of the composition, will cause a distinct reduction in the content of fluoride ions extractable with water of the cured masses.

The magnesium compounds may be present in the liquid composition in a dissolved or an undissolved form.

In the case of magnesium compounds soluble in the composition the addition is performed in a simple manner during the mixing process. Although soluble magnesium compounds are less effective than insoluble magnesium compounds as regards the reduction in the content of fluoride ions extractable with water, they offer the advantage of a greater homogeneity of the compositions, above all in low-viscosity compositions. A soluble magnesium compound of this kind is, for instance, magnesium acetylacetonate, a magnesium chelate compound.

The insoluble magnesium compounds, which are preferred owing to their greater effectiveness, may lead to inhomogeneities due to the settling of solid particles in the compositions. To reduce this risk it should be made sure that the magne- sium compounds are employed in a very finely divided form. The settling of the magnesium compounds from the liquid composition can additionally be reduced or avoided entirely by applying suitable thixotroping agents, such as pyrogenic silicic acids, which may be silanized, if required.

The at least one magnesium compound is preferably selected from the group consisting of magnesia, magnesium hydroxide, magnesium carbonate, magnesium silicate, magnesium carboxylates, magnesium chelates, and magnesium alcoholales. Of these, particular preference is given to the inorganic magnesium compounds, in particular magnesium silicate, magnesium carbonate, magnesium hydroxide, and magnesia, each alone or in a mixture with each other.

For many applications it is convenient to use especially pure magnesium compounds.

In another preferred embodiment of the invention, the polymerizable composition contains the magnesium compound(s) in a dispersed, finely divided form having a maximum particle size of 50 micrometers ($\mu$m).

Where magnesia is employed as one of the preferred magnesium compounds, both caustic, calcined magnesia and also sintered magnesia or fused magnesia may be utilized; a person of ordinary skill in the art will select the type which is most favorable for any particular application, depending on the composition of the polymerizable fluorine-containing composition.

Of the organic magnesium compounds, preference is given to magnesium carboxylates and magnesium alcoholates. Depending on the structure of the organic residue, these magnesium compounds may be soluble or insoluble in the polymerizable fluorine-containing composition.

Aside from the at least one magnesium compound, the polymerizable fluorine-containing composition may otherwise be composed in the most varied of ways. The mechanism of curing of the composition (cationic, anionic, radical or by poly-condensation) is of no importance here.

In a further preferred embodiment of the invention, the at least one polymerizable compound is a compound which contains at least one epoxide group and which is selected from the group consisting of glycidyl ethers and compounds con- taining epoxycyclohexyl groups.

Preferably utilized are aliphatic, cycloaliphatic and/or aromatic epoxy resins which may contain fluorine. The diglycidyl ethers of bisphenols, glycidyl ethers of novolaks and compounds containing epoxycyclohexyl groups such as for instance 3,4-epoxycyclohexylmethyl-3',4'-epoxycyclohexyl carboxylate or bis(3,4-epoxycyclohexylmethyl)adipate are typical representatives of this family.

Fluorine-containing (meth)acrylates may however also be used as polymerizable compounds.

The employment of at least one magnesium compound in accordance with the invention for the reduction in fluoride ions in the aqueous extract of the cured polymer masses is especially useful when fluorine-containing formulation constituents are, or have to be, applied for achieving specific effects in curing or in use of the polymer masses. This is the case for example in the cationic polymerization of epoxy resins where iodonium, sulphonium or ferrocenium compounds having a complex fluorine-containing anion are typically applied as catalysts or initiators. Preferably used anions are tetrakis(pentafluorophenyl)borate, hexafluoroantimonate, hexafluoroarsenate, hexafluorophosphate, and tetrafluoroborate, with the fluorine atoms in these complex anions being able to be partially replaced by hydroxyl groups.

For the polymerization of epoxy resins, borofluoride complexes are frequently applied as curing agents, for example the complexes of borofluoride with water, alcohols, ethers, thioethers, ammonia, amines, carboxylic acids, ketones, and aldehydes. A preferred family of compounds for these complex curing agents are the borofluoride complexes with secondary amines.

According to a further preferred embodiment of the invention the polymerizable fluorine-containing composition further contains at least one finely divided filler selected from the group consisting of quartz powder, fused silica powder, and pyrogenic silicic acid.

In the case of highly polymerized fillers and reinforcing agents such as, e.g., in the case of glasses and mineral fillers which are at least partially doped with magnesium, it may be useful to raise the concentration of the prefer- ably solid magnesium compound(s) up to the above-indicated upper limit of 60 parts by mass per 100 parts by mass of the total composition.

The effect of the magnesium compound(s) with respect to the reduction in fluoride ions in the aqueous extract is produced in the manner as described also in the presence of the finely divided fillers having a large surface area.

The composition according to the invention is employed in fields of application in which a low content of fluoride ions extractable with water is required. Such fields of application include, for example, the bonding, potting and coating of electronic devices, the mounting of electronic devices on printed circuit boards, and the manufacture of articles of medical techniques. An important field of application is the bonding and coating of articles of medical techniques which may come into contact with body fluids, for example dialysis filters, catheters, indwelling cannulas, cardiac pacemakers, arthroscopic apparatus, implantable hearing aids and artificial joints. In this field it is of vital importance to reduce the "bleeding" of toxic fluoride ions from the cured polymer mass as far as possible and not to change the osmolality of the body fluids.

Finally, the subject matter of the invention is a process for the preparation of cured polymer masses having a reduced content of fluoride ions extractable with water, comprising polymerizing and curing a polymerizable fluorine-containing composition containing at least one polymerizable compound and at least one fluorine-containing compound, the process being characterized in that at least one magnesium compound is added to the fluorine-containing composition prior to the polymerization.

The at least one magnesium compound is added preferably in an amount of from 0.001 to 60 parts by mass, in a particularly preferred embodiment in an amount of from 0.01 to 10 parts by mass per 100 parts by mass of the total composition.

The magnesium compound is preferably selected from the group consisting of magnesia, magnesium hydroxide, magnesium carbonate, magnesium silicate, magnesium carboxylates, magnesium chelates, and magnesium alcoholates.

It is particularly advantageous to add the magnesium com- pound in a dispersed, finely divided form having a maximum particle size of 50 micrometers ($\mu$m).

In the process according to the invention, a composition of the type as has been described above is preferably used as the fluorine-containing composition.

The invention will now be explained in more detail with the aid of examples.

All examples and comparative examples are based on the following operating sequences, unless otherwise stated:

Curing of the liquid masses

1. Radiation curing:

The homogeneous masses are exposed to light in a teflon casting mold using a UV lamp (Lux 03 manufactured by DELO Industrieklebstoffe) at an intensity of 50 mW/cm$^2$ from each side for 30 seconds. The resultant test specimens are of 10×60×1 mm in size.

2. Thermal curing:

The homogeneous masses are cured in a teflon casting mold at 120° C. for 1 hour.

Extraction

For extraction an apparatus is used which is comprised of the components as set forth below:

oil bath
reflux condenser
round-bottom flask

The cured sheet strips are broken in two in the middle and weighed into the extraction flask.

Weighed sample:

approx. 5 g sheet strips to an accuracy of 0.1 mg 48 g distilled water 0.250 g Triton X-100 p.a. (made by Merck, article no. 1.08603.1000)

The blank sample contains:

48 g distilled water 0.250 g Triton X-100 (see above)

Extraction is carried out under reflux at 100° C. for 24 hours.

Determination of the fluoride content

| | |
|---|---|
| Equipment: | ionic meter pMX 3000 |
| | fluoride-sensitive electrode |
| | reference electrode |
| Reagents: | TISAB sample conditioning solution |
| | (WTW order no.: 140100) |
| | 1000 ppm standard fluoride solution |
| Standards: | 0.1 ppm and 20 ppm fluoride in aq. dest. |
| Implementation: | 10.0 inl TISAB solution is added to 10.0 ml |
| | extract and standard solution, respectively. |

-continued

| | |
|---|---|
| | Prior to the determination a calibration is carried out by direct potentiometric measurement using the two standard solutions. Subsequently, the test solutions are measured. |
| Calculation: | Amount of fluoride in the extract* [ppm] = $$\frac{[\text{ppm F}^- \text{ (ext.)} - \text{ppm F}^- \text{ (blank value)}] \cdot m(\text{ext.})[g]}{m \text{ (cured mass)}[g]}$$ |

* as related to 1 g each of the cured mass.

Comparative Example 1:

A mixture of 34.33 wt. % of a cycloaliphatic epoxy resin (Sarcat K 126 made by Cray Valley), 45 wt. % of a partially epoxidized polybutadienediol (Poly bd 600 made by elf ato-chem), and 0.67% of a triarylsulphoniumhexafluoroantimonate (UVI 6974 made by UCC) is prepared in the absence of light. Preparation is immediately followed by photochemical curing, then the extraction is carried through and the content of fluoride ions is determined.

EXAMPLES 1–4

Varying amounts of different magnesium compounds are added to the solution described in Comparative Example 1.

The table shows the quantity found of extracted fluoride ions of the cured basic formulation and of formulations containing magnesium compounds:

| Ex. No. | magnesium compound added | (%) | fluoride qty. in extract [ppm] |
|---|---|---|---|
| Comp. Ex. | basic formulation | none | 460 |
| 1 | magnesium hydroxide (Merck company) | 1 | 3 |
| 2 | magnesium silicate (Woelm company) | 1 | 6 |
| 3 | magnesia (Anscor P of Redland Minerals) | 1 | 6 |
| 4 | magnesia | 0.1 | 7 |

Comparative Example 2

33% of a cycloaliphatic epoxy resin (Sarcat K 126 made by Cray Valley), 25% of a polycarbonatediol of the mean raolar mass of 510, and 41.5% of a silanized fused silica powder are mixed intensively. 0.5% of a triarylsulphonium-hexantimonate (UVI 6974 made by UCC) is stirred in in the absence of light.

The photochemically cured test specimens yield a content of fluoride ions of 65 ppm after extraction.

EXAMPLE 5

The addition of 0.1% magnesia (Anscor P of Redlands Minerals) to the solution of Comparative Example 2 reduces the content of extractable fluoride ions to 13 ppm.

Comparative Example 3

50.5% of a cycloaliphatic epoxy resin (Sarcat K 126 of Cray Valley), 45.0% of a partially epoxidized polybutadienediol (Poly bd 600 made by elf atochem), and 3.0% cumene hydroperoxide (80% in cumene) (Trigonox K 80 made by Akzo Nobel) are mixed intensively. In the absence of light, 1.5% of a 50% solution of $\eta^5$-2,4-cyclopentadiene-lyl-[$\eta$(1,2,3,4,5,6)-(1-methylethyl)-benzene]iron(1+) hexafluoroantimonate(1−) in propylene carbonate are added with stirring. The photochemically cured test specimens show a content of fluoride ions of 1200 ppm after extraction.

EXAMPLE 6

By adding 0.1% magnesia (Anscor P of Redlands Minerals) to the solution described in Comparative Example 3, it was possible to achieve a reduction to 6 ppm.

Comparative Example 4

54.5% of a cycloaliphatic epoxy resin (Sarcat K 126 of Cray Valley) and 45% Poly bd 600 (elf atochem) are homogenized intensively. 0.5% of a diaryliodonium(1+) tetrakis(pentafluorophenyl)borate(1−) (Rhodorsil 2074 of Rhône Poulenc) are stirred in in the absence of light. When the fluoride ions of the extract are determined, the photochemically cured test specimens of the solution yield a fluoride content of 520 ppm.

EXAMPLE 7

When adding 0.1% magnesia (Anscor P of Redlands Minerals) to the comparative solution 4, a fluoride content of 5 ppm in the extract is measured.

Comparative Example 5

84% of a cycloaliphatic epoxy resin (Uvacure 1500 of UCB) are homogeneously mixed with 10% of a polycarbonatediol of a mean molar mass of 510 and 3% of a silane-based adhesion promoter. While stirring carefully, 3% of a liquid borotrifluoride amine complex (Anchor 1040 made by Anchor) are added. Curing is performed by heating to 120° C. for 1 hour. The determination of the extract yielded a fluoride quantity of 470 ppm.

EXAMPLE 8

By adding 1% finely divided magnesia (Anscor P of Redlands Minerals) to the solution described in Comparative Example 5, it was possible to lower the quantity of extractable fluoride ions to 260 ppm.

What is claimed is:

1. A polymerizable fluorine-containing composition containing at least one polymerizable compound and at least one fluorine-containing compound, wherein the composition additionally contains at least one magnesium compound and has, after curing, a low content of fluoride ions extractable with water.

2. The composition of claim 1, wherein the content of fluoride ions extractable with water after curing is lower by at least 40% as compared with the content of fluoride ions extractable with water of an otherwise identical composition which does not contain a magnesium compound.

3. The composition of claim 2, wherein the content of fluoride ions extractable after curing is lower by at least 60% than without a magnesium compound.

4. The composition of claim 1, wherein said at least one magnesium compound is present in an amount of from 0.001 to 60 parts by mass per 100 parts by mass of the total composition.

5. The composition of claim 1, wherein said magnesium compound is selected from the group consisting of magnesia, magnesium hydroxide, magnesium carbonate, magnesium silicate, a magnesium carboxylate, a magnesium chelate, and a magnesium alcoholate.

6. The composition of claim 1, said magnesium compound is present in a dispersed, finely divided form having a maximum particle size of 50 micrometers ($\mu$m).

7. The composition of claim 1, wherein said at least one polymerizable compound is a compound which contains at least one epoxide group selected from the group consisting of a glycidyl ether group and an epoxycyclohexyl group.

8. The composition of claim 1, wherein said at least one fluorine-containing compound is selected from the group consisting of tetrakis (pentafluorophenyl)borate, hexafluoroantimonate, hexafluoroarsenate, hexafluorophosphate, tetrafluoroborate, a complex of borofluoride with water, an alcohol, an ether, a thioether, ammonia, an amine, a carboxylic acid, a ketone and an aldehyde and/or a complex of borofluoride with a compound comprising at least one secondary amino group.

9. The composition of claim 8, wherein the fluorine atoms in said fluorine-containing compounds, as far as complex anions are concerned, are partially replaced by OH-groups.

10. The composition of claim 1, and further comprising at least one finely divided filler selected from the group consisting of quartz powder, fused silica powder, and pyrogenic silicic acid.

11. A process for the preparation of cured polymer masses having a reduced content of fluoride ions extractable with water, in which a polymerizable fluorine-containing composition containing at least one polymerizable compound and at least one fluorine-containing compound is polymerized and cured, comprising adding at least one magnesium compound to said fluorine-containing composition, prior to the polymerization.

12. The process of claim 11, wherein said at least one magnesium compound is added in an amount of from 0.001 to 60 parts by mass per 100 parts by mass of the total composition.

13. The process of claim 11, wherein said magnesium compound is selected from the group consisting of magnesia, magnesium hydroxide, magnesium carbonate, magnesium silicate, a magnesium carboxylate, a magnesium chelate, and a magnesium alcoholate.

14. The process of claim 13, wherein said magnesium compound is added in a dispersed, finely divided form having a maximum particle size of 50 micrometers ($\mu$m).

15. The process of claim 11, wherein a composition according to claim 7 is used as said fluorine-containing composition.

16. The process of claim 11, wherein a composition according to claim 8 is used as said fluorine-containing composition.

17. The process of claim 11, wherein a composition according to claim 9 is used as said fluorine-containing composition.

18. The process of claim 11, wherein a composition according to claim 10 is used as said fluorine-containing composition.

19. In a method of bonding, potting and coating of electronic devices by means of a polymerizable fluorine-containing composition containing at least one polymerizable compound and at least one fluorine-containing compound, the improvement wherein the composition of claim 8 is used as said polymerizable fluorine-containing composition.

20. In a method of bonding, potting and coating of electronic devices by means of a polymerizable fluorine-containing composition containing at least one polymerizable compound and at least one fluorine-containing compound, the improvement wherein the composition of claim 9 is used as said polymerizable fluorine-containing composition.

21. In a method of bonding, potting and coating of electronic devices by means of a polymerizable fluorine-containing composition containing at least one polymerizable compound and at least one fluorine-containing compound, the improvement wherein the composition of claim 10 is used as said polymerizable fluorine-containing composition.

22. In a method of mounting electronic devices on printed circuit boards by means of a polymerizable fluorine-containing composition containing al least one polymerizable compound and at least one fluorine-containing compound, the improvement wherein the composition of claim 8 is used as said polymerizable fluorine-containing composition.

23. In a method of mounting electronic devices on printed circuit boards by means of a polymerizable fluorine-containing composition containing at least one polymerizable compound and at least one fluorine-containing compound, the improvement wherein the composition of claim 9 is used as said polymerizable fluorine-containing composition.

24. In a method of mounting electronic devices on printed circuit boards by means of a polymerizable fluorine-containing composition containing at least one polymerizable compound and at least one fluorine-containing compound, the improvement wherein the composition of claim 10 is used as said polymerizable fluorine-containing composition.

25. In a method of manufacturing articles of medical techniques by using a polymerizable fluorine-containing composition containing at least one polymerizable compound and at least one fluorine-containing compound, the improvement wherein the composition of claim 8 is used as said polymerizable fluorine-containing composition.

26. In a method of manufacturing articles of medical techniques by using a polymerizable fluorine-containing composition containing at least one polymerizable compound and at least one fluorine-containing compound, the improvement wherein the composition of claim 9 is used as said polymerizable fluorine-containing composition.

27. In a method of manufacturing articles of medical techniques by using a polymerizable fluorine-containing composition containing at least one polymerizable compound and at least one fluorine-containing compound, the improvement wherein the composition of claim 10 is used as said polymerizable fluorine-containing composition.

* * * * *

UNITED STATES PATENT AND TRADEMARK OFFICE
CERTIFICATE OF CORRECTION

PATENT NO. : 6,284,827 B1
DATED : September 4, 2001
INVENTOR(S) : Eckhardt et al.

It is certified that error appears in the above-identified patent and that said Letters Patent is hereby corrected as shown below:

<u>Title page,</u>
Item [73], insert "&" after -- GmbH --
Item [74], "Haynes" should be -- Hayes --

<u>Column 8,</u>
Line 17, "al" should be -- at --

Signed and Sealed this

Fourth Day of June, 2002

*Attest:*

JAMES E. ROGAN
*Attesting Officer*   *Director of the United States Patent and Trademark Office*